(12) United States Patent
Fukami et al.

(10) Patent No.: US 10,705,122 B2
(45) Date of Patent: Jul. 7, 2020

(54) PROBE CARD

(71) Applicant: KABUSHIKI KAISHA NIHON MICRONICS, Tokyo (JP)

(72) Inventors: Yoshiyuki Fukami, Tokyo (JP); Hidehiro Kiyofuji, Tokyo (JP); Noboru Otabe, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 58 days.

(21) Appl. No.: 16/091,445

(22) PCT Filed: Mar. 21, 2017

(86) PCT No.: PCT/JP2017/011129
§ 371 (c)(1),
(2) Date: Oct. 4, 2018

(87) PCT Pub. No.: WO2017/175573
PCT Pub. Date: Oct. 12, 2017

(65) Prior Publication Data
US 2019/0154730 A1    May 23, 2019

(30) Foreign Application Priority Data

Apr. 8, 2016  (JP) .................................. 2016-078500

(51) Int. Cl.
*G01R 1/06* (2006.01)
*G01R 1/073* (2006.01)
(Continued)

(52) U.S. Cl.
CPC ........... *G01R 1/07342* (2013.01); *G01R 1/07* (2013.01); *G01R 1/07307* (2013.01);
(Continued)

(58) Field of Classification Search
CPC ...... G01R 1/07342; G01R 1/06; G01R 1/067; G01R 1/06705; G01R 1/06772–06788;
(Continued)

(56) References Cited

U.S. PATENT DOCUMENTS 6,765,400 B2 * 7/2004 Ido ..................... G01R 1/07378
324/756.03
7,378,860 B2 * 5/2008 Volkerink .......... G01R 31/2886
324/754.07
(Continued)

FOREIGN PATENT DOCUMENTS

CN         1512186 A       7/2004
JP     2003344448 A      12/2003
(Continued)

OTHER PUBLICATIONS

Office Action dated Aug. 30, 2019 in KR Application No. KR10-2018-7029085.
(Continued)

*Primary Examiner* — Jermele M Hollington
*Assistant Examiner* — Taqi R Nasir
(74) *Attorney, Agent, or Firm* — Muncy, Geissler, Olds & Lowe, P.C.

(57) ABSTRACT

Provided is a probe card with which the adjustment of height deviations of needle tip parts of probes and the adjustment of parallelism between the probes and an object to be inspected are simplified. The probe card 1 has: a wiring substrate 2 having wiring 4 therein or on a surface thereof or the like; a plurality of probes 3; and a dielectric film 6. The dielectric film 6 is disposed to be spaced a distance away from a main surface 8 of the wiring substrate 2 at a position spaced away further from the wiring substrate 2 than the needle tip parts 13 of the probes 3, so that one surface 21 of the dielectric film 6 faces the needle tip parts 13 and faces
(Continued)

the main surface 8 that is a probe installation surface of the wiring substrate 2. The probe card 1 configures a state in which the needle tip parts 13 face an electrode of an object to be inspected with the dielectric film 6 interposed between the probe card 1 and the needle tip parts 13, during an inspection of the object to be inspected. An inspection signal supplied from an inspection device to the probes 3 is set as an alternating current signal, and the probe card 1 causes capacitive coupling between the needle tip parts 13 and the electrode of the object to be inspected, and transmits the inspection signal.

10 Claims, 7 Drawing Sheets

(51) Int. Cl.
*G01R 1/07* (2006.01)
*G01R 31/302* (2006.01)
*G01R 1/067* (2006.01)

(52) U.S. Cl.
CPC ........ *G01R 31/302* (2013.01); *G01R 1/06727* (2013.01); *G01R 1/06772* (2013.01); *G01R 1/0735* (2013.01)

(58) Field of Classification Search
CPC ...... G01R 1/073; G01R 1/07314; G01R 3/00; G01R 27/2676; G01R 1/07307; G01R 1/07; G01R 31/302; G01R 1/06727; G01R 1/0735
See application file for complete search history.

(56) References Cited

U.S. PATENT DOCUMENTS

| | | | |
|---|---|---|---|
| 2004/0012405 A1* | 1/2004 | Cheng | G01R 1/07378 324/756.03 |
| 2004/0070413 A1 | 4/2004 | Kasukabe et al. | |
| 2006/0250150 A1 | 11/2006 | Tunaboylu et al. | |
| 2008/0265933 A1* | 10/2008 | Tanioka | G01R 31/2886 324/756.04 |
| 2008/0297185 A1* | 12/2008 | Kang | G01R 1/07314 324/754.07 |
| 2010/0321054 A1* | 12/2010 | Kameda | G01R 31/3025 324/754.07 |
| 2015/0022223 A1 | 1/2015 | Grayson | |

FOREIGN PATENT DOCUMENTS

| | | |
|---|---|---|
| JP | 2004138452 A | 5/2004 |
| JP | 2005-331523 A | 12/2005 |
| JP | 2011-099698 A | 5/2011 |
| JP | 2012-042329 A | 3/2012 |
| KR | 20020057364 A | 10/2002 |
| KR | 20080005288 A | 1/2008 |
| WO | WO-2009/099122 A1 | 8/2009 |
| WO | WO-2013/134422 A1 | 9/2013 |

OTHER PUBLICATIONS

Chinese Office Action in application No. 201780022545.4 dated Apr. 2, 2020; pp. 1-6.

* cited by examiner

PROBE CARD

TECHNICAL FIELD

The present invention relates to a probe card.

BACKGROUND ART

A large number of semiconductor chips such as ICs built in a semiconductor wafer are subjected to an electrical test as to whether or not the semiconductor chips have the performance as specified in the specifications thereof, before being cut and separated from the semiconductor wafer. In an example, such an electrical test is performed by a method of supplying inspection signals to electrodes of the semiconductor chips on the semiconductor wafer, and analyzing the detected signals.

Conventionally, in the above-described electrical test of the semiconductor chips, a probe card is used as an inspection jig, in order to electrically connect the electrodes of the semiconductor chips and an electric circuit or the like of a wiring substrate for test disposed to be spaced.

The probe card is configured with, for example, a large number of conductive probes for inspection. Patent Document 1 discloses a probe card using cantilever type probes. Patent Document 2 discloses a probe card using vertical type probes.

Figure 7:
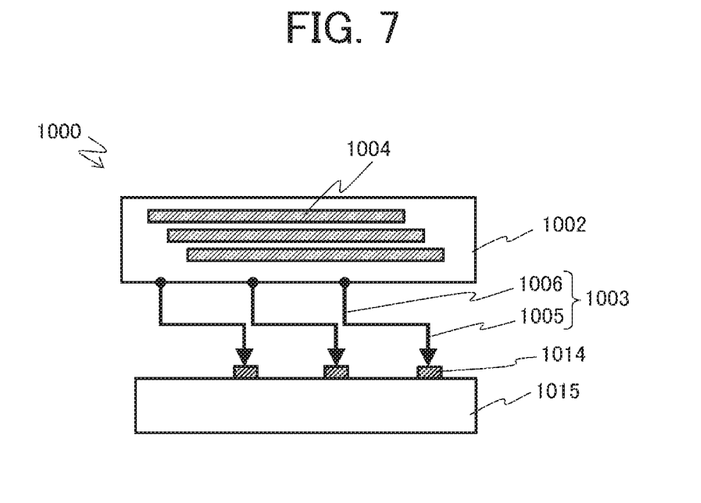
FIG. 7 is a diagram for schematically explaining an electrical test of the semiconductor chips using a conventional probe card.

FIG. 7 is a diagram for schematically explaining an electrical test of semiconductor chips using a conventional probe card.

As shown in FIG. 7, a conventional probe card 1000 has a wiring substrate 1002 having a wiring 1004 and a plurality of probes 1003. The probes 1003 are, for example, cantilever type probes. Each of the probes 1003 has a needle tip part 1005 at one end portion and an attaching part 1006 at the other end portion. The probe 1003 is attached to the main surface of the wiring substrate 1002 via the attaching part 1006.

The probe card 1000 is used as an inspection jig for electrical connection to perform an inspection such as an electrical test or the like of an object to be inspected having an electrode. As shown in FIG. 7, an object to be inspected is, for example, a semiconductor chip (not shown) built in a semiconductor wafer 1015 having electrode pads 1014 of electrodes. In the electrical test of the semiconductor chips, the plurality of probes 1003 mounted on the probe card 1000 are respectively and simultaneously brought into contact with the corresponding electrode pads 1014 of the semiconductor chips of the semiconductor wafer 1015. In the electrical test of the semiconductor chips, inspection signals are transmitted and received between each of the electrode pads 1014 and each of the probes 1003.

In the case where the semiconductor chips are inspected using a conventional probe card like the probe card 1000 shown in FIG. 7, all the electrodes to be inspected of the semiconductor chips and all the probes of the probe card are required to be simultaneously brought into contact with each other.

Meanwhile, circuit dimensions required for semiconductor elements are being steadily decreased owing to the recent trend toward higher integration and larger capacity of Large Scale Integration (LSI). In an example, a pattern formation in a typical logic device is demanded with a line width of several tens nm.

Patent Document 1: Japanese Unexamined Patent Application, Publication No. 2011-099698

Patent Document 2: Japanese Unexamined Patent Application, Publication No. 2012-042329

DISCLOSURE OF THE INVENTION

Problems to be Solved by the Invention

In response to such high integration of semiconductor elements and such decreasing in circuit dimensions, the probes of a probe card serving as an inspection jig are also being miniaturized and narrowed in pitches. In a normal probe card, the work for adjusting the heights of the probes thereof is required for the electrical test of semiconductor chips, in order to realize that the probes are simultaneously in contact with all the electrodes of the semiconductor chips.

Specifically, the difficulty is being steadily increased, in the work for adjusting the height deviations of the needle tip parts of the probes and in the work for adjusting the parallelism between the semiconductor chips serving as objects to be inspected and the probe card. As a result, a problem arises in that the number of semiconductor chips to be inspected per unit time decreases, and the inspection period of time is prolonged. In the probe card, the difficulty in such adjustment work is increasing steadily.

The object of the present invention is to provide a probe card with which the adjustment of height deviations of needle tip parts of probes and the adjustment of parallelism between the probes and object to be inspected are simplified.

Means for Solving the Problems

A first aspect of the present invention relates to a probe card used for testing an object to be inspected having an electrode, and transmitting and receiving an inspection signal to and from the electrode. The probe card includes
a wiring substrate having wiring,
at least one probe having a needle tip part at one end portion and being attached to a main surface of the wiring substrate at the other end portion, the needle tip part being disposed to be spaced a distance away from the main surface of the wiring substrate, and
a dielectric film disposed to be spaced a distance away from the main surface of the wiring substrate at a position spaced away further from the wiring substrate than the needle tip part, so as to face the main surface of the wiring substrate and also to face the needle tip part. The needle tip part is disposed so as to face the electrode in a state with the dielectric film interposed between the needle tip part and the electrode, and transmits and receives the inspection signal to and from the electrode, in the state with the dielectric film interposed.

In the first aspect of the present invention, the state with the dielectric film interposed preferably corresponds to a state where the electrode is in contact with the dielectric film, while the needle tip part is in contact with the dielectric film at a position where the needle tip part faces the electrode.

In the first aspect of the present invention, the needle tip part is preferably coupled capacitively with the electrode in the state with the dielectric film interposed between the needle tip part and electrode, thereby transmitting and receiving the inspection signal to and from the electrode.

In the first aspect of the present invention, the dielectric film is preferably supported to the wiring substrate so that the distance from the wiring substrate is changeable.

In the first aspect of the present invention, at least a part of a peripheral portion of the dielectric film is preferably supported by a supporting member, and the supporting member is preferably attached to the wiring substrate so that the distance between the wiring substrate and the dielectric film is changeable.

In the first aspect of the present invention, the dielectric film is preferably configured with a flexible member.

In the first aspect of the present invention, the state with the dielectric film interposed preferably corresponds to a state where the electrode is in contact with the dielectric film, while the needle tip part is in contact with the dielectric film at a position where the needle tip part faces the electrode, and the dielectric film is preferably configured with a flexible member.

In the first aspect of the present invention, the dielectric film is preferably made of at least one of a paper material and a resin material.

In the first aspect of the present invention, the dielectric film is preferably configured with a flexible member, and preferably made of at least one of a paper material and a resin material.

In the first aspect of the present invention, the probe preferably corresponds to a cantilever type probe or a vertical type probe.

Effects of the Invention

The present invention provides a probe card with which the adjustment of height deviations of needle tip parts of probes and the adjustment of parallelism between the probes and an object to be inspected are simplified.

PREFERRED MODE FOR CARRYING OUT THE INVENTION

A probe card according to one embodiment of the present invention, which has probes for inspection and a dielectric film, causes capacitive coupling by making the probes face an electrode of an object to be inspected with a dielectric film interposed between the probes and the electrodes, thereby transmitting and receiving an inspection signal.

Some embodiments according to the present invention will be described below with reference to the accompanying drawings.

Figure 1:
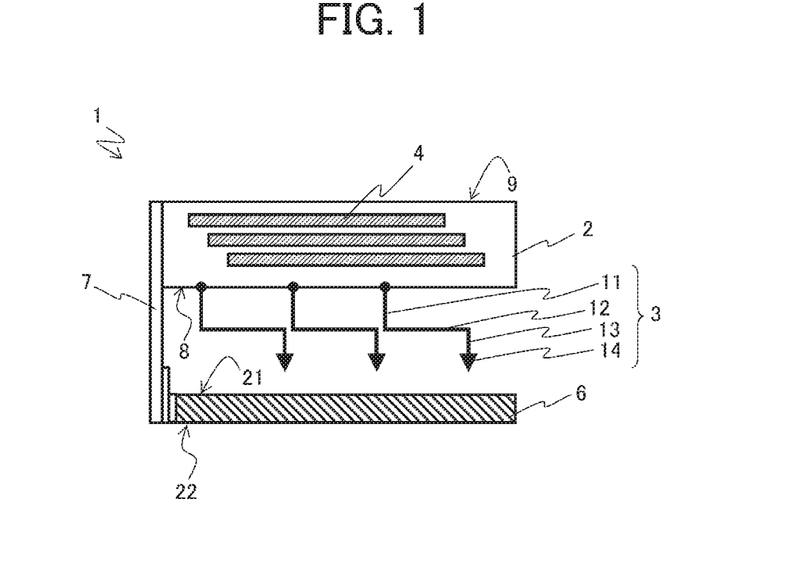
FIG. 1 is a cross-sectional view schematically illustrating a structure of a probe card according to one embodiment of the present invention.

FIG. 1 is a cross-sectional view schematically illustrating a structure of the probe card according to one embodiment of the present invention.

As shown in FIG. 1, a probe card 1 according to one embodiment of the present invention includes a wiring substrate 2 having a wiring 4 therein, on the surface thereof or the like, probes 3, and a dielectric film 6. The probes 3 are provided on a main surface 8 of the wiring substrate 2. The probes 3 may be of, for example, a cantilever type. In this case, the probes 3 are arranged at predetermined positions on the wiring substrate 2, so as to be supported in a cantilevered manner on the main surface 8 of the wiring substrate 2. In the embodiment of the present invention, the probes 3 of the probe card 1 may be of, for example, a vertical type.

The probe card 1 is used to inspect an object to be inspected having an electrode. The structure of the prove card 1 according to one embodiment of the present invention will be detailed with reference to the drawings.

The wiring substrate 2 of the probe card 1 is configured with a printed wiring substrate made of a resin material such as a glass epoxy resin. In an example, the wiring substrate 2 may be provided with terminals (not shown) for connection to an inspection device such as a prober on an opposite surface 9 which is the opposite side to the main surface 8 that is an installation surface of the probes 3. In the wiring substrate 2, the terminals of the wiring 4 are electrically and independently connected to the respective probes 3 via the wiring 4.

As described above, at least one probe 3 is provided on the main surface of the wiring substrate 2. As illustrated in FIG. 1, two or more of the probes 3 are preferably provided on the main surface of the wiring substrate 2.

As described above, the probes 3 may be of, for example, a cantilever type. In FIG. 1, the probes 3 of a cantilever type are illustrated schematically.

Each of the probes 3 illustrated in FIG. 1 has an attaching part 11 serving as an attaching end to the wiring substrate 2. The probe 3 further has an arm-like main body portion 12 extending in the lateral direction (horizontal direction) in FIG. 1, from the end portion (the lower end portion in FIG. 1) of the attaching part 11. The probe 3 further has a needle tip part 13 extending from the tip of the main body portion 12 in the vertical direction in FIG. 1, that is, downward. A needle point 14 is formed at the tip of the needle tip part 13.

In other words, the probe 3 has the needle tip part 13 at one end portion and the attaching part 11 to the wiring substrate 2 at the other end portion. The probe 3 is disposed on the main surface 8 of the wiring substrate 2 via the attaching part 11.

The probe 3, which is made of a conductive material, for example, tungsten, has conductivity. As shown in FIG. 1, the probe 3 having such a structure is supported in a cantilevered manner on the main surface 8 of the wiring substrate 2 of the probe card 1, so as to be arranged at a predetermined position on the main surface 8. In an example, in the probe card 1 shown in FIG. 1, each of the needle tip parts 13 of the probes 3 is configured so as to extend in a direction away from the main surface 8 that is the probe installation surface of the wiring substrate 2.

Specifically, as shown in FIG. 1, in the case where the main surface 8 that is the probe installation surface of the wiring substrate 2 is directed downward in the drawing, each of the needle points 14 that are the tips of the needle tip parts 13 of the probes 3 is configured so as to be directed downward or diagonally downward in the drawing, that is, in the same direction as the direction of the main surface 8 directed.

As a result, the needle tip parts 13 of the probes 3 are disposed to be spaced a distance away from the main surface 8 of the wiring substrate 2. Specifically, as shown in FIG. 1, the needle tip parts 13 of the probes 3 are disposed to be directed downward and to be spaced a distance away from the main surface 8 of the wiring substrate 2.

In the probe card 1, the dielectric film 6 is configured with a sheet-shaped insulating film. The dielectric film 6 has a flat plate-like shape, that is, a flat-board shape.

The dielectric film 6 is disposed to be spaced a distance away from the wiring substrate 2. In other words, the dielectric film 6 is disposed to be spaced a distance away from the main surface 8 of the wiring substrate 2 at a position spaced away further from the wiring substrate 2 than the needle tip parts 13, so that one surface 21 of the dielectric film 6 faces the needle tip parts 13 and the main surface 8 that is the probe installation surface of the wiring substrate 2.

The arrangement structure of the dielectric film 6 in the probe card 1 is detailed.

In an example, as shown in FIG. 1, the main surface 8 of the wiring substrate 2 is directed downward in the drawing. In such a case, the dielectric film 6 is disposed to be spaced a distance away from the wiring substrate 2 so that the one surface 21 faces the main surface 8 of the wiring substrate 2 that is disposed above the dielectric film 6.

In this case, the dielectric film 6 is disposed at a position spaced away further from the wiring substrate 2 than the needle tip parts 13 of the probes 3. Thus, the dielectric film 6 is disposed at a position further away from the wiring substrate 2, compared to the needle points 14 that are disposed at the tips of the needle tip parts 13. Specifically, in the example where the probe card 1 is disposed as shown in FIG. 1, the dielectric film 6 is disposed at a position downward away from the wiring substrate 2, so that the one surface 21 faces the main surface 8 of the wiring substrate 2.

The dielectric film 6 is disposed so as to face the main surface 8 of the wiring substrate 2, and also to face the needle tip parts 13 of the probes 3. In other words, in the dielectric film 6, the one surface 21 faces the main surface 8 of the wiring substrate 2, and also faces the needle points 14 of the needle tip parts 13 of the probes 3. In the example shown in FIG. 1, the dielectric film 6 is disposed so that the one surface 21 faces the needle tip parts 13 located above the one surface 21, at a position downward away from the main surface 8 of the wiring substrate 2.

The dielectric film 6 has a flat-board shape as described above. The dielectric film 6 preferably has a size enough to simultaneously cover all the electrodes of the objects to be inspected having electrodes. In an example, the dielectric film 6 may have the same size (for example, the area) as the electrode forming surface of the objects to be inspected, or the same size (for example, the area) as the main surface of the wiring substrate 2. The dielectric film 6 may have the same shape as that of a semiconductor substrate in plan view, for example, a substantially circular shape in plan view.

The dielectric film 6 is configured with an insulating member. The dielectric film 6 is preferably configured with a flexible member, having moderate flexibility. In the probe card 1, the dielectric film 6 having moderate flexibility enables to simplify the adjustment of height deviations of the needle tip parts 13 of the probes 3 and the adjustment of parallelism between the probes 3 and the objects to be inspected, as will be described below.

Material using cellulose, for example, a paper material may serve as material for the dielectric film 6.

A resin material may also serve as material for the dielectric film 6. Examples of the above-described resin material include polyvinyl chloride resin, polyvinylidene chloride resin, polyvinyl alcohol resin, polystyrene resin, styrene-acrylonitrile copolymer, styrene-butadiene-acrylonitrile copolymer, high-density polyethylene resin, medium-density polyethylene resin, low-density polyethylene resin, ethylene-vinyl acetate copolymer, polypropylene resin, polyacetal resin, polymethyl methacrylate resin, methacrylic-styrene copolymer, polycarbonate resin, polyethylene terephthalate resin, polyimide resin, polyamide resin, polyurethane resin, trifluorochloroethylene resin, tetrafluoroethylene resin, tetrafluoroethylene-hexafluoropropylene copolymer, tetrafluoroethylene-perfluoroalkoxyethylene copolymer, tetrafluoroethylene-ethylene copolymer, vinylidene fluoride resin, and the like.

Material having a dielectric constant (relative permittivity) preferably serves as material for the dielectric film 6, and its relative permittivity value is preferably high.

A high dielectric constant material having a relative permittivity as described above serves as material for the dielectric film 6, whereby the probes 3 are capable of effectively transmitting and receiving signals between the electrodes of the objects to be inspected and the probes 3, as will be described below. In other words, the probes 3 under the state of being electrically disconnected via the dielectric film 6 are capacitively coupled with the electrodes of the objects to be inspected, thereby enabling to transmit and receive signals to and from the electrodes of the objects to be inspected.

The dielectric film 6 preferably has a thin thickness (the distance between the surface 21 and a surface 22 shown in FIG. 1). The dielectric film 6 is formed to have a thin thickness as described above, whereby the probes 3 are capable of effectively transmitting and receiving signals to and from the electrodes of the objects to be inspected, as will be described below.

As described above, in the probe card 1, the dielectric film 6 is disposed to be spaced a distance away from the wiring substrate 2, and the one surface 21 is disposed to face the main surface 8 of the wiring substrate 2 at a position spaced away further from the main surface 8 than the needle tip parts 13, whereby the one surface 21 is also disposed to face the needle tip parts 13.

As will be described below, the probe card 1 is disposed so that the needle tip parts 13 face the electrodes of the objects to be inspected with the dielectric film 6 interposed between the needle tip parts 13 and the objects to be inspected, in order to transmit and receive inspection signals to and from the electrodes of the objects to be inspected. Accordingly, in the probe card 1, as illustrated in FIG. 1, the one surface 21 of the dielectric film 6 may be in the state of being spaced away from all of the needle points 14 of the needle tip parts 13 of the probes 3, or may be in the state of contacting at least one of the needle points 14 of the probes 3.

In order to realize such an arrangement structure of the dielectric film 6, the probe card 1 has a supporting member 7, as shown in FIG. 1. In the probe card 1, at least a part of the peripheral portion of the dielectric film 6 is supported by the supporting member 7. The supporting member 7 is attached to the wiring substrate 2 so that the distance between the wiring substrate 2 and the dielectric film 6 is changeable. The probe card 1 has the integrated structure in which the dielectric film 6 is supported on and integrated with the wiring substrate 2 by the supporting member 7.

The description below is about an example structure of the probe card 1, in which the dielectric film 6 is supported by use of the supporting member 7.

Figure 2:
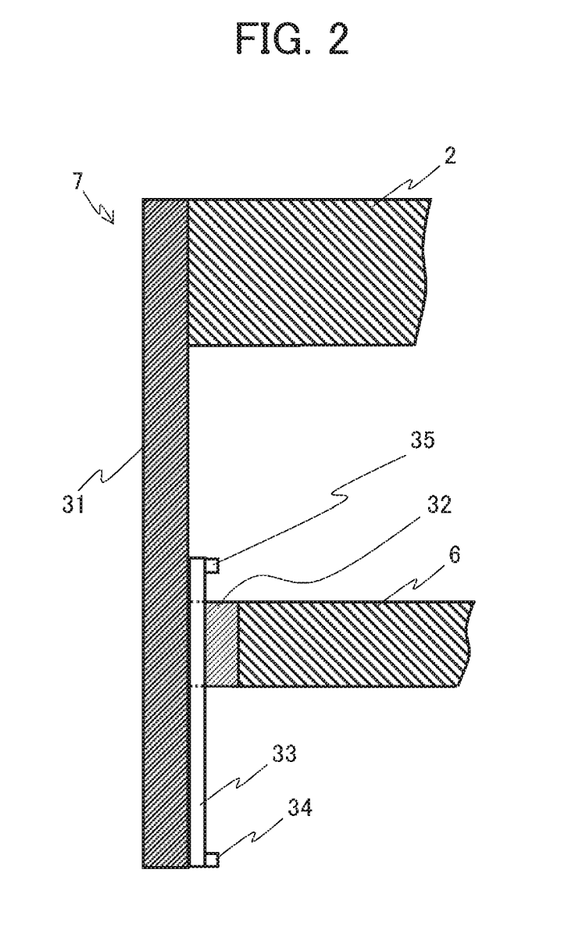
FIG. 2 is a cross-sectional view schematically illustrating a supporting member attached to a wiring substrate of the probe card according to one embodiment of the present invention.

FIG. 2 is a cross-sectional view schematically illustrating the supporting member attached to the wiring substrate of the probe card according to one embodiment of the present invention.

As shown in FIG. 2, in the probe card 1, the supporting member 7 has a column 31, a sliding part 32, a guide rail 33, a first stopper 34, and a second stopper 35.

The upper end portion of the supporting member 7 is attached to the peripheral edge portion of the wiring substrate 2, whereby the supporting member 7 is fixed to the wiring substrate 2. The guide rail 33 is attached to the inner wall of the lower end portion of the supporting member 7. The first stopper 34 and the second stopper 35 are respectively provided on both ends of the guide rail 33, in contact with the sliding part 32 so as to restrict the range in which the sliding part 32 moves. Specifically, the first stopper 34 is provided at the lower end portion of the guide rail 33, while the second stopper 35 is provided at the upper end portion.

The sliding part 32 is guided by the guide rail 33 in the direction perpendicular to the main surface 8 of the wiring substrate 2 (in the vertical direction in FIG. 1). The sliding part 32 is restricted in the downward movement thereof by the first stopper 34. Accordingly, as shown in FIG. 1, in an example case where the main surface 8 of the wiring substrate 2 is directed downward in the drawing, the first stopper 34 is capable of preventing the sliding part 32 from dropping off downward from the column 31.

The sliding part 32 is restricted also in the upward movement thereof by the first stopper 34. Accordingly, the first stopper 34 is capable of preventing the one surface 21 of the dielectric film 6 from excessively coming into contact with the needle points 14 of the probes 3.

In this manner, the dielectric film 6 is fixedly attached to the sliding part 32 of the supporting member 7. In an example, a part of the peripheral portion of the dielectric film 6 is attached to the sliding part 32 of the supporting member 7.

As described above, the dielectric film 6 is held by the supporting member 7 between the first stopper 34 and the second stopper 35 to the wiring substrate 2, so as to be movable in the directions toward and away from the main surface 8 of the wiring substrate 2. In an example, as shown in FIG. 1, the dielectric film 6 is held to the wiring substrate 2 via the sliding part 32 by the supporting member 7 between the first stopper 34 and the second stopper 35, so as to be movable in the vertical direction in the drawing.

As described above, the dielectric film 6 herein is made of, for example, a resin material or the like, having moderate flexibility in some cases.

In such a case, the probe card 1 may be equipped with a holding member having an appropriate structure for the dielectric film 6, so that the flat-board-shaped dielectric film 6 is not impaired significantly in its shape owing to bending or the like of the flat-board-shaped dielectric film 6. In the probe card 1, the supporting member 7 is capable of supporting the dielectric film 6 integrated with the holding member.

The holding member described above for the dielectric film 6 preferably has, for example, a circular frame shape with the central region thereof opened, and preferably has strength enough to suppress large deformation such as bending of the dielectric film 6. The material, shape and the like of the holding member are detailed below.

Figure 3:
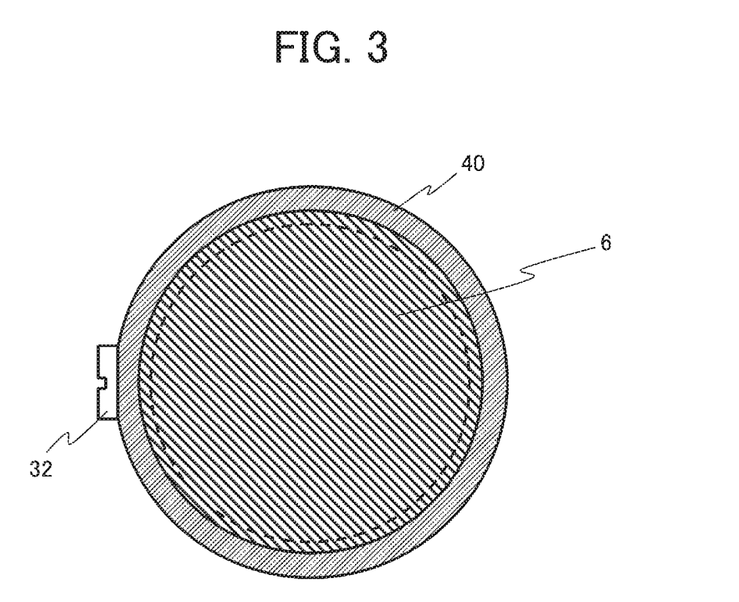
FIG. 3 is a plan view schematically illustrating a holding member for a dielectric film to be used in the probe card according to one embodiment of the present invention.

FIG. 3 is a plan view schematically illustrating the holding member for the dielectric film to be used in the probe card according to one embodiment of the present invention.

FIG. 3 shows the dielectric film 6 and a holding member 40 for holding the dielectric film 6, and schematically shows the sliding part 32 of the supporting member 7.

As described above, the holding member 40 has a circular frame shape with the central region thereof opened. The holding member 40 may be made of wood, a metal material such as aluminum or stainless steel, a resin material, or the like.

As shown in FIG. 3, in the probe card 1, the peripheral portion of the dielectric film 6 is fixed by the holding member 40, thereby being held on the holding member 40. The dielectric film 6 may be fixed to the holding member 40 by, for example, adhesion using an appropriate adhesive.

Alternatively, the dielectric film 6 may be held in such a manner that two circular frame-shaped holding members 40 with the central regions thereof opened are prepared, the pair of holding members 40 are opposed to each other with the dielectric film 6 interposed between the holding members 40, and the peripheral portion of the dielectric film 6 is interposed in the vertical direction. In this case, an adhesive for bonding the dielectric film 6 to the holding members 40 may not be always required.

As shown in FIG. 3, in the dielectric film 6 held by the holding member 40, the dielectric film 6 along with the holding member 40 is fixedly attached to the sliding part 32 of the supporting member 7. As a result, in the structure of the probe card 1, at least a part of the peripheral portion of the dielectric film 6 is supported by the supporting member 7 via the holding member 40.

The probe card 1 according to one embodiment of the present invention having the above-described structure is available for inspection of objects to be inspected having electrodes. In an example, the probe card 1 is used as an inspection jig for electrical connection of semiconductor chips serving as objects to be inspected.

The description below is about the inspection of objects to be inspected using the probe card 1 according to one embodiment of the present invention.

As described above, the probe card 1 according to one embodiment of the present invention shown in FIG. 1 is available for inspection of objects to be inspected having electrodes. In this case, for example, semiconductor chips which are formed on a semiconductor wafer and have electrode pads serving as electrodes for inspection on the semiconductor wafer may serve as objects to be inspected having electrodes.

Figure 4:
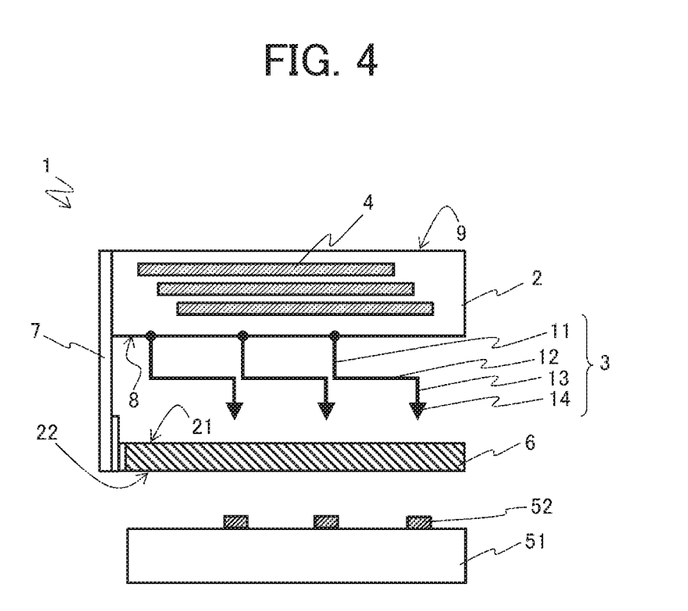
FIG. 4 is a diagram for schematically explaining a method of electrically testing semiconductor chips using the probe card according to one embodiment of the present invention.

FIG. 4 is a diagram for schematically explaining a method of electrically testing the semiconductor chips using the probe card according to one embodiment of the present invention.

FIG. 4 schematically shows the probe card 1 to be used for an electrical test and a semiconductor wafer 51 having semiconductor chips serving as objects to be inspected. A large number of semiconductor chips are built in the semiconductor wafer 51. The semiconductor chips are regularly arranged in the longitudinal direction and the lateral direction in the surface on which the semiconductor chips of the semiconductor wafer 51 are formed.

It is noted that the probe card 1 shown in FIG. 4 is identical to the probe card 1 shown in FIG. 1, and the common constituent elements are denoted by the same reference numerals, and thus duplicate explanation will be omitted as much as possible. In FIG. 4, illustration of the semiconductor chips built in the semiconductor wafer 51 is omitted for the sake of convenience. Only the electrode pads 52 serving as electrodes for inspection of the semiconductor chips are illustrated schematically.

As described with reference to FIG. 1, the probe card 1 shown in FIG. 4 is configured to have the wiring substrate 2 having the wiring 4 therein, on the surface thereof or the like, the plurality of probes 3, and the dielectric film 6. As described above, the probes 3 may be of, for example, a cantilever type. The plurality of probes 3 are attached to the main surface 8 of the wiring substrate 2, respectively.

The dielectric film 6 is supported by the supporting member 7, as described with reference to FIG. 2 and other diagrams. The supporting member 7 is attached to the wiring substrate 2 so that the distance between the wiring substrate 2 and the dielectric film 6 is changeable, and is integrated with the wiring substrate 2, the probes 3, and the like. The dielectric film 6 is disposed to be spaced a distance away from the main surface 8 of the wiring substrate 2 at a position spaced away further from the wiring substrate 2 than the needle tip parts 13 of the probes 3, so that the one surface 21 faces the main surface 8 of the wiring substrate 2 and also faces the needle tip parts 13.

The probe card 1 having such a structure is used as an inspection jig for electrical connection of the semiconductor chips serving objects to be inspected in the electrical test as described above. Therefore, when the electrical test is started, the probe card 1 is aligned so that the needle points 14 of the needle tip parts 13 of the probes 3 face the corresponding electrode pads 52 of the semiconductor chips, respectively.

More specifically, in the state illustrated in FIG. 1, the probe card 1 is disposed with respect to the semiconductor chips, by adjusting the positions between the needle tip parts 13 of the probe card 1 and the electrode pads 52 of the semiconductor chips so that the needle tip parts 13 face the electrode pads 52. In other words, the probe card 1 and the electrode pads 52 are adjusted in their positions in the horizontal direction (left-right direction) shown in FIG. 1 and FIG. 4, so that the needle tip parts 13 face the electrode pads 52.

In this case, although the dielectric film 6 is disposed between the needle tip parts 13 and the electrode pads 52, the needle tip parts 13 and the electrode pads 52 are respectively disposed to be spaced away from the dielectric film 6 and to face each other.

Thereafter, in the electrical test, the probe card 1 as it is in the state where the needle tip parts 13 face the electrode pads 52 moves toward the semiconductor chips (semiconductor wafer 51). In other words, in the example of FIG. 4, the probe card 1 moves toward the semiconductor wafer 51 located below to come closer to the semiconductor chips from above the semiconductor chips.

Figure 5:
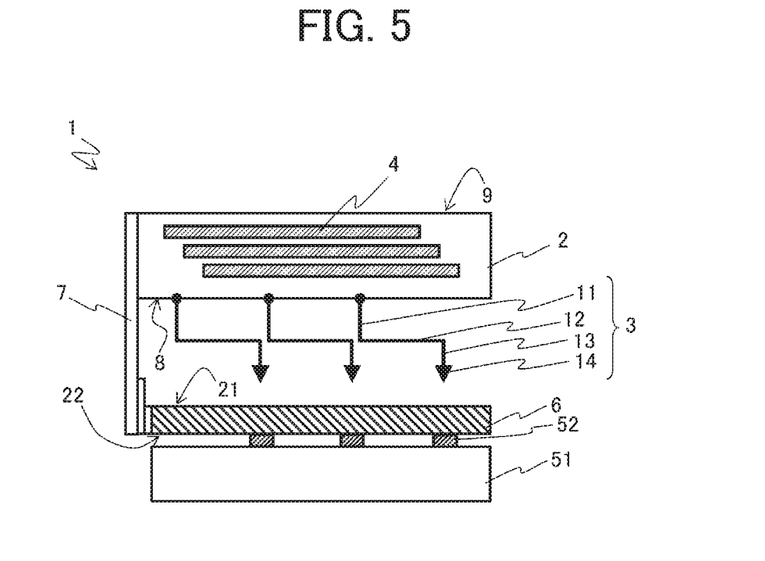
FIG. 5 is a cross-sectional view schematically illustrating the state in which the dielectric film of the probe card according to one embodiment of the present invention is in contact with electrode pads.

FIG. 5 is a cross-sectional view schematically illustrating the state in which the dielectric film of the probe card according to one embodiment of the present invention is in contact with the electrode pads.

As shown in FIG. 5, the dielectric film 6 of the probe card 1 is disposed so as to come into contact with the electrode pads 52 of the semiconductor chips, thereby covering all of the electrode pads 52 on the semiconductor wafer 51. In other words, the dielectric film 6 is disposed so as to cover all of the electrode pads 52 on the semiconductor wafer 51 from above.

Nextly, the probe card 1 as it is in the state in which the needle tip parts 13 face the electrode pads 52 moves to come closer to the semiconductor chips (semiconductor wafer 51).

In this case, as described above, the dielectric film 6 is supported to the wiring substrate 2 so that the distance from the wiring substrate 2 is changeable. In other words, the probe card 1 is configured so that the distance between the wiring substrate 2 and the dielectric film 6 is changeable.

Accordingly, the dielectric film 6 does not move as it is in the state of being in contact with the electrode pads 52. Only the wiring substrate 2 and the probes 3 attached to the main surface 8 of the wiring substrate 2 move to come closer to the electrode pads 52. In other words, as shown in FIG. 5, the probes 3 move downward in the drawing toward the electrode pads 52, as it is in the state in which the dielectric film 6 is kept in contact with the electrode pads 52.

Figure 6:
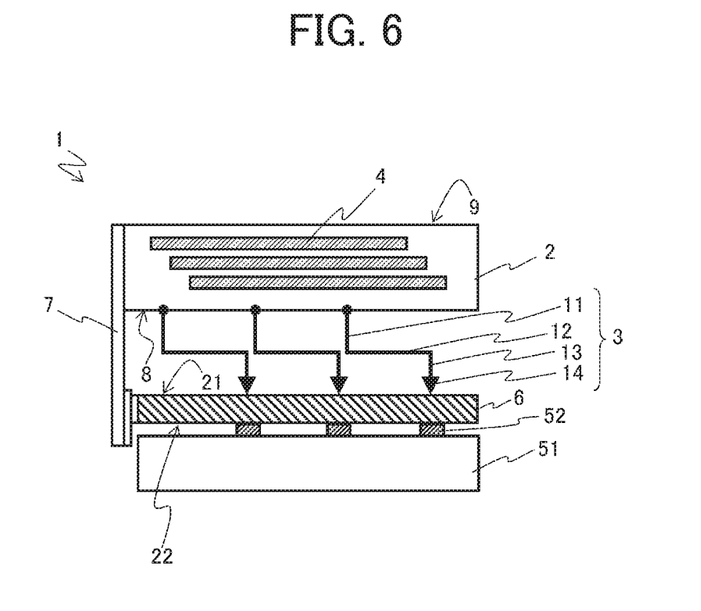
FIG. 6 is a cross-sectional view schematically illustrating the state in which probes of the probe card according to one embodiment of the present invention face the electrode pads with the dielectric film interposed between the probes and the electrode pads.

FIG. 6 is a cross-sectional view schematically illustrating the state in which the probes of the probe card according to one embodiment of the present invention face the electrode pads with the dielectric film interposed between the probes and the electrode pads.

When the probes 3 move downward in the figure toward the electrode pads 52, the probes 3 come into contact with the dielectric film 6, as shown in FIG. 6. The needle tip parts 13 of the probes 3 become in the state of facing the electrode pads 52 of the semiconductor chips with the dielectric film 6 interposed between the needle tip parts 13 and the electrode pads 52. In an example, as shown in FIG. 6, the needle tip parts 13 and the electrode pads 52 become in the state of facing each other with the dielectric film 6 interposed therebetween in the vertical direction.

As described above, in the probe card 1, in the electrical test of the semiconductor chips, the needle tip parts 13 become in the state of facing the corresponding electrode pads 52 with the dielectric film 6 interposed between the needle tip parts 13 and the electrode pads 52. The needle tip parts 13 and the electrode pads 52 are disposed with the dielectric film 6 interposed therebetween, thereby becoming in the state of being electrically disconnected (hereinafter referred to as "the state with the dielectric film interposed") between the needle tip parts 13 and the electrode pads 52.

In the probe card 1, as described above, the terminal (not shown) provided on the surface 9 of the wiring substrate 2 is used to transmit and receive an inspection signal between each of the probes 3 and an inspection device (not shown) such as a prober or the like.

In this case, in the probe card 1, if the inspection signal from the inspection device is a direct current signal, such an inspection signal is not available for transmission or reception. In other words, as shown in FIG. 6, the probe card 1 with the dielectric film 6 interposed is in the state in which the above-described insulating dielectric film is interposed between the needle tip parts 13 and the electrode pads 52, and thus a direct current signal is not available for transmission or reception.

However, in the probe card 1, the inspection signal supplied from the inspection device to each of the probes 3 is able to be set as an alternating current signal. In this case, the probe card 1 causes capacitive coupling between the needle tip parts 13 of the probes 3 and the electrode pads 52 of the semiconductor chips, and transmits such inspection signals or performs other processing, thereby enabling to transmit and receive the inspection signals.

Accordingly, the probe card 1 is available as an inspection jig for electrical connection, for the electrical test of objects to be inspected. In other words, the probe card 1 is available for the electrical test of the semiconductor chips by a method of supplying alternating current signals as inspection signals to the electrode pads 52 of the semiconductor chips serving as objects to be inspected, and then analyzing the detected signals.

In this case, as described above, the probe card 1 with the dielectric film 6 interposed between the needle tip parts 13 of the probes 3 and the electrode pads 52 of the semiconductor chips causes capacitive coupling therebetween, thereby transmitting the inspection signals.

Therefore, in the probe card 1, the dielectric film 6 is preferably made of a material having a high relative permittivity. The dielectric film 6 is made of a material having a high dielectric constant, thereby enabling to cause highly-efficient capacitive coupling between the needle tip parts 13 and the electrode pads 52.

In the probe card 1, the above-described state with the dielectric film interposed preferably correspond to the state in which the electrode pads 52 are in contact with the dielectric film 6, while the needle tip parts 13 are in contact with the dielectric film 6 at the positions in which the needle tip parts 13 face the electrode pads 52. In other words, the state illustrated in FIG. 6 described above is preferable, in which both of the needle tip parts 13 and the electrode pads 52 are in contact with the dielectric film 6, and face each other with the dielectric film 6 interposed therebetween. Realizing such a state enables to cause highly-efficient capacitive coupling between the needle tip parts 13 and the electrode pads 52.

The probe card 1 has the dielectric film 6, whereby, for example, even in the case where the needle tip parts 13 of the probes 3 have height deviations, the height deviations are able to be absorbed during when the needle tip parts 13 are in contact with the dielectric film 6.

In an example, the above-described probe card 1 illustrated in FIG. 1 and FIG. 4 may have deviations in height positions of the needle points 14 of the needle tip parts 13 of the probes 3, that is, in the height positions from the main surface 8 of the wiring substrate 2, in some cases. Even in such a case of having the deviations in the height positions of the needle tip parts 13, the probe card 1 in the state illustrated in FIG. 6 is capable of absorbing the height deviations by local deformation or the like of the dielectric film 6.

In the probe card 1 during the electrical test illustrated in FIG. 4 described above, a dislocation in parallelism may occur between the probe card 1 and the semiconductor wafer 51 having the semiconductor chips serving as objects to be inspected, in some cases.

In such a case where a dislocation in parallelism occurs, the distances between the needle points 14 and the electrode pads 52 of the semiconductor chips may differ among the probes 3 in some cases, even if the probe card 1 has no deviation in height positions of the needle points 14 of the needle tip parts 13 of the probes 3. In an example, in the case where the probe card 1 is disposed obliquely to the semiconductor wafer 51, some of the needle points 14 of the plurality of probes 3 are disposed closer to or disposed further from the electrode pads 52, as compared with the case where the probe card 1 is disposed in parallel to the semiconductor wafer 51. Such a state results in becoming in the state same as the above-described state where the probe card 1 has deviations in height positions of the needle points 14.

However, even in the case where a dislocation in parallelism occurs between the probe card 1 and the semiconductor wafer 51, and further where the deviations as described above occur, the probe card 1 in the state illustrated in FIG. 6 is capable of absorbing the deviations among the probes 3 in the distances between the needle tip parts 13 and the electrode pads 52 by deformation, for example, denting of the dielectric film 6.

Accordingly, as described above, the dielectric film 6 is preferably configured with a flexible member, having moderate flexibility and thickness.

Even in the case where the probe card 1 has height deviations of the needle tip parts 13 of the probes 3, or where a dislocation in parallelism occurs between the probe card 1 and the semiconductor wafer 51, and thus such a state needs to be adjusted, the probe card 1 is expected to absorb the deviations or the dislocation by deformation or the like of the dielectric film 6, and is capable of simplifying such adjustment work with lower difficulty.

As described above, the above electrical test using the probe card 1 is performed by a method of supplying the inspection signals to the electrode pads serving as the electrodes for inspection of the semiconductor chips on the semiconductor wafer, and then analyzing the detected signals. Performing of the electrical test enables to inspect the objects to be inspected by checking whether or not the semiconductor chips have the performance as specified in the specifications thereof, before the semiconductor chips are cut and separated from the semiconductor wafer.

In the inspection of the objects to be inspected such as semiconductor chips, the use of the probe card 1 enables to increase the number of semiconductor chips that can be inspected per unit time, and to shorten the inspection period.

It is noted that the present invention is not limited to the above-described embodiments, and various modifications are available without departing from the spirit of the present invention.

In an example, the probe card 1 according to one embodiment of the present invention has one supporting member 7 as shown in FIG. 1 and other drawings, or alternatively the number of the supporting members is not limited to one. In the probe card 1, the number of supporting members 7 may be two or more. The probe card 1 is configured to have a larger number of the supporting members 7 each having the same structure so that the plurality of supporting members 7 support the peripheral portions of the dielectric film 6, thereby enabling to more stably support the dielectric film 6 by the supporting members 7. In this case, the dielectric film 6 is supported preferably in such a manner that the holding member 40 for suppressing deformation of the dielectric film 6 is provided, and each of the sliding parts 32 of the plurality of supporting members 7 is fixedly attached to the holding member 40.

This application, which is based on Japanese Patent Application No. 2016-078500 (filed on Apr. 8, 2016), claims the priority based on Japanese Patent Application No. 2016-078500 according to the Paris Convention. The contents disclosed in Japanese Patent Application No. 2016-078500 is hereby incorporated by referring to Japanese Patent Application No. 2016-078500.

Although representative embodiments of the present invention have been detailed, it should be understood that various changes, substitutions and alternatives may be made without departing from the spirit and scope of the invention as defined in the claims. Even if the claims are amended in the application procedure, the inventors intend that the equivalent scope of the claimed invention be maintained.

EXPLANATION OF REFERENCE NUMERALS

1, 1000 PROBE CARD
2, 1002 WIRING SUBSTRATE 3, 1003 PROBE
4, 1004 WIRING
6 DIELECTRIC FILM
7 SUPPORTING MEMBER
8 MAIN SURFACE
9, 21, 22 SURFACE
11, 1006 ATTACHING PART
12 MAIN BODY PORTION
13, 1005 NEEDLE TIP PART
14 NEEDLE POINT
31 COLUMN
32 SLIDING PART
33 GUIDE RAIL
34 FIRST STOPPER
35 SECOND STOPPER
40 HOLDING MEMBER
51, 1015 SEMICONDUCTOR WAFER
52, 1014 ELECTRODE PAD

The invention claimed is:

1. A probe card used for testing an object to be inspected having an electrode and for transmitting and receiving an inspection signal to and from the electrode, the probe card comprising:
    a wiring substrate having wiring;
    at least one probe having a needle tip part at one end portion and being attached to a main surface of the wiring substrate at the other end portion, the needle tip part being disposed to be spaced a distance away from the main surface of the wiring substrate; and
    a dielectric film disposed to be spaced a distance away from the main surface of the wiring substrate at a position spaced away further from the wiring substrate than the needle tip part, so as to face the main surface of the wiring substrate and also to face the needle tip part, wherein
    the needle tip part is disposed so as to face the electrode in a state with the dielectric film interposed between the needle tip part and the electrode, and transmits and receives the inspection signal to and from the electrode, in the state with the dielectric film interposed.

2. The probe card according to claim 1, wherein
the state with the dielectric film interposed is a state where the electrode is in contact with the dielectric film, while the needle tip part is in contact with the dielectric film at a position where the needle tip part faces the electrode.

3. The probe card according to claim 1, wherein
the needle tip part is capacitively coupled with the electrode in the state with the dielectric film interposed between the needle tip part and electrode, thereby transmitting and receiving the inspection signal to and from the electrode.

4. The probe card according to claim 1, wherein
the dielectric film is supported to the wiring substrate so that the distance from the wiring substrate is changeable.

5. The probe card according to claim 1, wherein
at least a part of a peripheral portion of the dielectric film is supported by a supporting member, and
the supporting member is attached to the wiring substrate so that the distance between the wiring substrate and the dielectric film is changeable.

6. The probe card according to claim 1, wherein
the dielectric film is configured with a flexible member.

7. The probe card according to claim 2, wherein
the dielectric film is configured with a flexible member.

8. The probe card according to claim 1, wherein
the dielectric film is made of at least one of a paper material and a resin material.

9. The probe card according to claim 6, wherein
the dielectric film is made of at least one of a paper material and a resin material.

10. The probe card according to claim 1, wherein
the probe is a cantilever type probe or a vertical type probe.

* * * * *